United States Patent
Schoenfeld et al.

(10) Patent No.: US 6,396,727 B1
(45) Date of Patent: May 28, 2002

(54) INTEGRATED CIRCUIT HAVING CONDUCTIVE PATHS OF DIFFERENT HEIGHTS FORMED FROM THE SAME LAYER STRUCTURE AND METHOD FOR FORMING THE SAME

(75) Inventors: Aaron Schoenfeld; Rajesh Somasekharan, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/505,943

(22) Filed: Feb. 15, 2000

Related U.S. Application Data

(63) Continuation of application No. 08/928,556, filed on Sep. 12, 1997, now abandoned.

(51) Int. Cl.$^7$ .................................................. G11C 5/02
(52) U.S. Cl. ...................... 365/51; 365/161; 365/230.06
(58) Field of Search ........................... 365/51, 52, 161, 365/164, 230.06, 189.05

(56) References Cited

U.S. PATENT DOCUMENTS

| | | | |
|---|---|---|---|
| 4,824,521 A | 4/1989 | Kulkarni et al. ............. 156/643 |
| 4,958,222 A | 9/1990 | Takakura et al. ............. 357/84 |
| 5,055,423 A | 10/1991 | Smith et al. ................. 437/187 |
| 5,138,403 A | 8/1992 | Spitzer ......................... 357/15 |
| 5,331,196 A | * 7/1994 | Lowrey et al. .............. 257/529 |
| 5,341,026 A | 8/1994 | Harada et al. ............... 257/764 |
| 5,363,325 A | 11/1994 | Sunouchi et al. ............ 365/149 |
| 5,375,095 A | 12/1994 | Yamada et al. ......... 365/230.03 |
| 5,396,100 A | 3/1995 | Yamasaki et al. ............. 257/390 |
| 5,516,726 A | 5/1996 | Kim et al. .................... 437/189 |
| 5,543,358 A | 8/1996 | Jimenez ....................... 437/195 |
| 5,580,809 A | * 12/1996 | Mori et al. .................... 437/48 |
| 5,658,819 A | 8/1997 | Humphrey et al. .......... 438/600 |
| 5,693,568 A | 12/1997 | Liu et al. ...................... 437/195 |
| 5,730,835 A | 3/1998 | Roberts et al. ........... 156/656.1 |
| 5,818,089 A | 10/1998 | Kokubo et al. .............. 257/368 |
| 5,874,779 A | 2/1999 | Matsuno ....................... 257/758 |
| 5,883,007 A | 3/1999 | Abraham et al. ............ 438/714 |
| 6,100,590 A | 8/2000 | Yegnashankaran et al. . 257/758 |
| 6,178,113 B1 * | 1/2001 | Gonzalez et al. ....... 365/185.03 |
| 6,189,582 B1 * | 2/2001 | Reinberg et al. ............. 143/239 |

* cited by examiner

*Primary Examiner*—David Nelms
*Assistant Examiner*—Thong Le
(74) *Attorney, Agent, or Firm*—Dorsey & Whitney LLP

(57) ABSTRACT

An integrated circuit includes a substrate having a surface. A first conductive path is disposed on the substrate at a first level and has a first height. A second conductive path is also disposed on the substrate at the first level and has a second height that is significantly different than the first height. Where the integrated circuit is a memory circuit, the digit lines formed from a layer can have a smaller height than other signal lines that are formed from the same layer. Thus, the capacitive coupling between the digit lines can be reduced without degrading the current carrying capability of the other signal lines.

27 Claims, 5 Drawing Sheets

INTEGRATED CIRCUIT HAVING CONDUCTIVE PATHS OF DIFFERENT HEIGHTS FORMED FROM THE SAME LAYER STRUCTURE AND METHOD FOR FORMING THE SAME

CROSS-REFERENCE TO RELATED APPLICATION

This application is a continuation of U.S. patent application Ser. No. 08/928,556, filed Sep. 12, 1997, now abandoned.

TECHNICAL FIELD

The invention relates generally to an integrated circuit having conductive paths of different heights formed in the same layer structure, and more particularly to a memory circuit having one or more digit lines formed from a conductive layer structure having a first thickness and one or more signal lines formed from the conductive layer structure and having a second, greater thickness.

BACKGROUND OF THE INVENTION

To accommodate continuing consumer demand for integrated circuits that perform the same or additional functions and yet have a reduced size as compared with available circuits, circuit designers continually search for ways to reduce the size of the memory arrays within these circuits without sacrificing array performance. One technique for reducing the size of a memory array is to decrease the spacing between adjacent digit lines.

A problem with decreasing this spacing is that it increases the line-to-line coupling capacitance between adjacent digit lines. As the coupling capacitance increases, the memory read and write times are often increased due to the longer time required to charge and discharge the increased line-to-line coupling capacitance. Furthermore, the increased coupling capacitance may cause increased cross talk between adjacent digit lines, and thus may cause reading and writing errors.

Digit-line coupling capacitance is proportional to the side areas of adjacent lines, and is inversely proportional to the distances between them. One technique for reducing digit-line cross coupling is to increase the distance between adjacent digit lines. But this would increase the size of the array, and thus of the circuit containing the array. Reducing the digit-line widths to effectively increase the distances between adjacent digit-lines is often impractical due to process and functional limitations.

Another technique for reducing cross coupling in digit lines is to reduce the height, i.e., thickness, of the lines. But this may cause unwanted effects in other signal lines formed from the same metallization level. For example, the power and ground lines are often formed in the same metallization level as the digit lines. The power and ground lines must be thick enough to carry the required current. But reducing the thickness of this metallization level to reduce the thicknesses of the digit lines would also reduce the thicknesses of the power and ground lines, thus possibly decreasing their current-carrying capacities below acceptable levels.

SUMMARY OF THE INVENTION

In accordance with one aspect of the invention, an integrated circuit includes a substrate having a surface. A first conductive path having a first height is disposed on the substrate at a first level. A second conductive path is also disposed on the substrate at the first level and has a second height that is significantly different than the first height.

Where the integrated circuit is a memory circuit, the digit lines formed from a layer can have a smaller height than other signal lines that are formed from the same layer. Thus, the capacitive coupling between the digit lines is reduced without degrading the current carrying capability of the other signal lines. Furthermore, the reduced coupling capacitance often reduces or eliminates data read/write errors.

BRIEF DESCRIPTION OF THE DRAWINGS

FIG. 1 is a first cross-sectional view that shows a method for forming a memory circuit according to a first embodiment of the invention.

FIG. 2 is a second cross-sectional view that shows a method for forming a memory circuit according to a first embodiment of the invention.

FIG. 3 is third cross-sectional view that shows a method for forming a memory circuit according to a first embodiment of the invention.

FIG. 4 is a fourth cross-sectional view that shows a method for forming a memory circuit according to a first embodiment of the invention.

FIG. 5 is a first cross-sectional view that shows a method for forming a memory circuit according to a second embodiment of the invention.

FIG. 6 is a second cross-sectional view that shows a method for forming a memory circuit according to a second embodiment of the invention.

FIG. 7 is a third cross-sectional view that shows a method for forming a memory circuit according to a second embodiment of the invention.

DETAILED DESCRIPTION OF THE INVENTION

Figure 1:
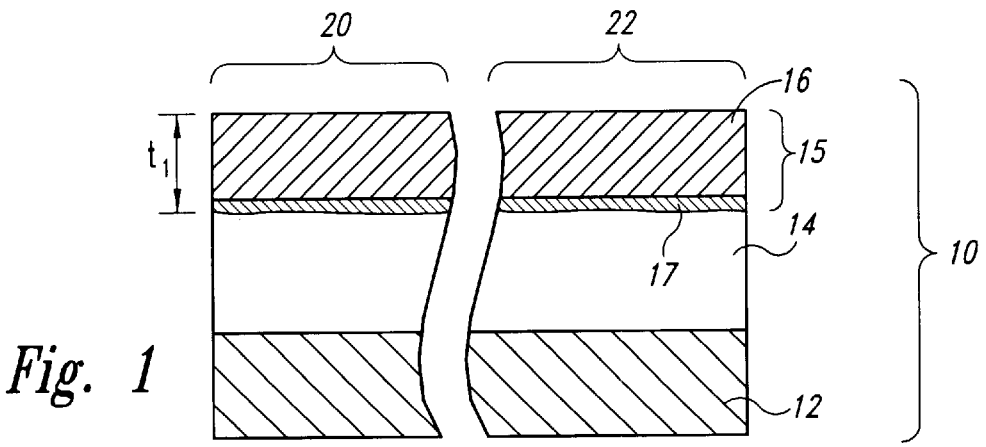
FIGS. 1–4 are cross-sectional views that show a method for forming a memory circuit according to a first embodiment of the invention.

Referring to FIG. 1, an integrated circuit, such as a memory circuit, is formed from a semiconductor layer structure 10, which includes a substrate 12 that is conventionally formed from a material such as silicon. The structure 10 includes an insulator layer 14 that is formed on the substrate 12 at a first level, and a conductive layer structure 15 having a thickness $t_1$, that is formed on the layer 14 at a second level. In one embodiment, the structure 10 includes a single conductive layer 16 that is disposed on the insulator layer 14. In another embodiment, the layer structure 15 may also include a conventional barrier layer 17, which may be formed from titanium or titanium nitride and be between 100 and 1,000 Angstroms (Å) thick. For example, the insulator layer 14 may be formed from silicon dioxide or another conventional dielectric, and the conductive layer 16 may be formed from polysilicon, silicided polysilicon, a metal, such as aluminum that is deposited by conventional sputtering, or another conductive material. Additionally, it is understood that the layer structure 15 may not have a uniform thickness over its area, in which case the thickness $t_1$, is an average thickness. Furthermore, for clarity, only layers 14, 16 and 17 are shown, it being understood that other layers may be disposed between the stubstrate 12 and the layer 14, or between the layers 14 and 16.

Figure 2:
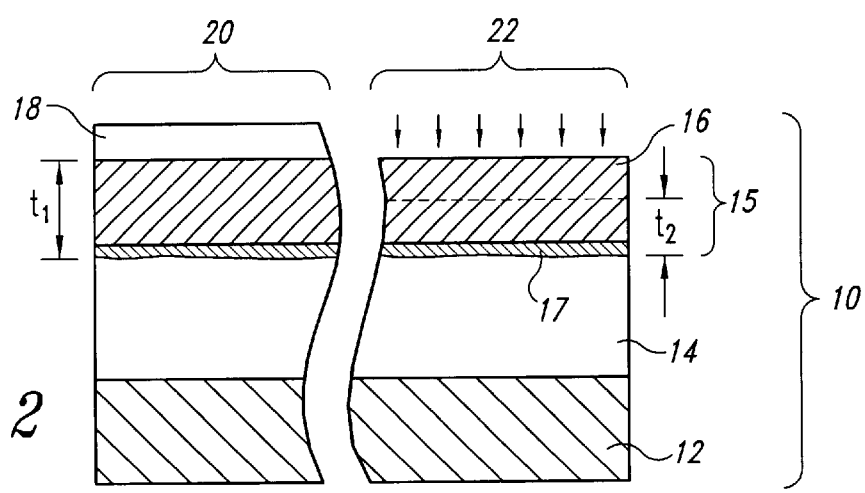

Referring to FIG. 2, a first mask 18 is conventionally formed over a first region 20 of the structure 10 where signal lines are to be formed. A region 22 or the structure 10 where the digit lines are to be formed is left exposed. Next, the thickness of the layer structure 15 in the exposed region 22 is conventionally reduced to a desired thickness $t_2$. For example, the portion of the layer 16 in the exposed region 22 may be isotropically or anisotropically etched. Then, the mask 18 is removed. Although shown formed as a single layer structure, in other embodiments of the invention the layer structure 15 may comprise two portions that are separately formed in the regions 20 and 22 using conventional techniques and having the same thickness $t_1$. Alternatively, the portion of the layer structure 15 over the region 22 may be formed having the thickness $t_2$ to eliminate the thickness-reducing etching step.

Figure 3:
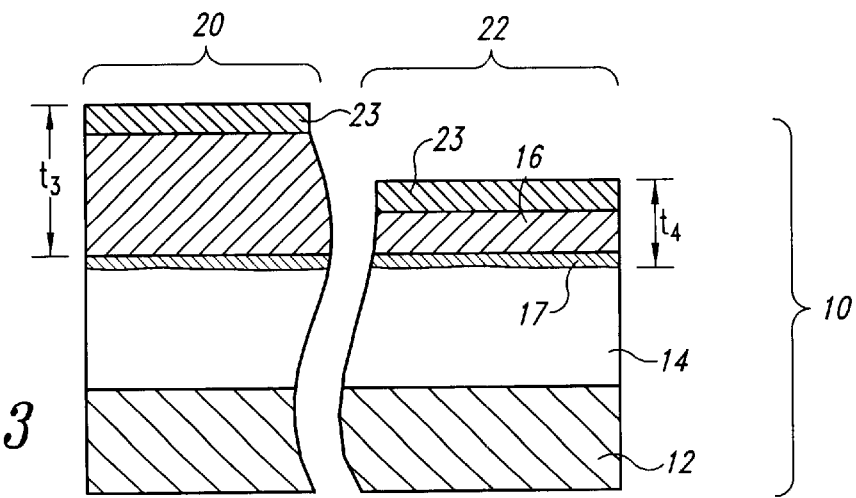

In one embodiment shown in FIG. 3, an optional anti-reflective coating, i.e., cap layer 23, is then formed over the layer 16 after the mask is removed. For example, the cap layer 23 may include the same material as the barrier layer 17.

With further reference to FIG. 3, the portions of the conductive layer 16, the barrier 17, and the cap layer 23 in the region 20 have or substantially have a combined thickness $t_3$, and the portions of the conductive layer 16, barrier layer 17 and the cap layer 23 in the region 22 and the cap layer 23 have a reduced thickness $t_4$, which is significantly less than the thickness $t_3$. In embodiments that do not include the layer 23, $t_3=t_1$ and $t_4=t_2$.

Figure 4:
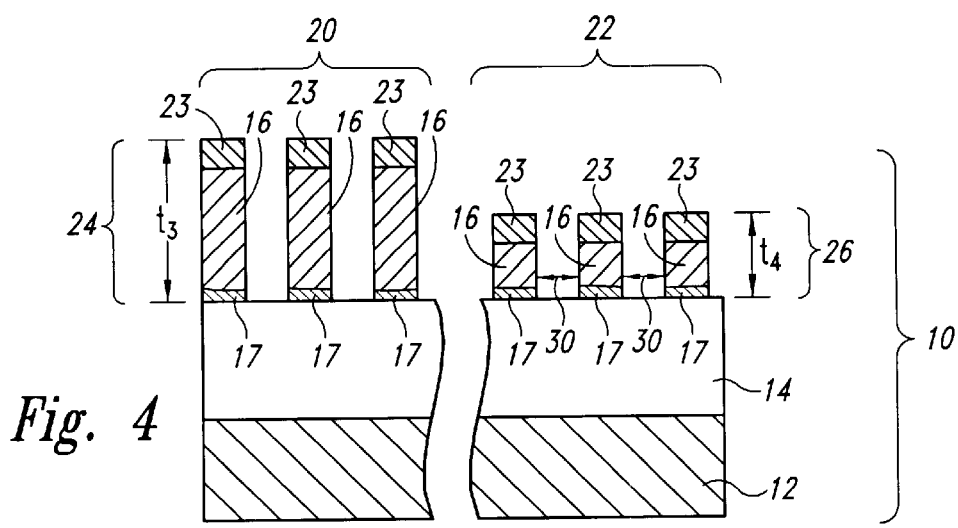

Referring to FIG. 4, signal lines 24 having substantially the thickness $t_3$, are formed by conventionally etching the portions of the layers 16, 17, and 23 in the region 20, and digit lines 26 having substantially the thickness $t_4$ are formed by conventionally etching the portions of the layers 16, 17, and 23 in the region 22. In one embodiment, the digit lines 26 are approximately 4000 Å thick, and the signal lines 24 are approximately 8000 Å thick.

Thus, lines having different thicknesses can be formed in the same level of a semiconductor structure such as the structure 10, and can also be formed from the same layer structure of material.

Furthermore, it is well known from capacitor theory that as the overlapping area of the capacitor plates decreases, the capacitance also decreases. Thus, in the described embodiment, the reduction in the thicknesses of the digit lines 26 reduces the areas of the sides 30, and thus reduces the coupling capacitances between adjacent ones of the lines 26. In a dynamic random access memory (DRAM), this decrease in coupling capacitance increases the ratio between the cell capacitance and the coupling capacitance, thus making more charge available to charge the cell capacitance. Therefore, reducing the coupling capacitances often increases the reading and writing speeds of the memory cells coupled to the lines 26, and thus often reduces or eliminates reading and writing errors due to cross talk.

It is true that reducing the thickness of the digit lines increases their resistance. However, the reduction in coupling capacitance is significantly greater than the increase in resistance. Therefore, there is an overall increase in the reading and writing speeds as discussed above.

It is well known that as the thickness of a line is reduced, the line's current-carrying capacity is also reduced. In some embodiments of the invention, the signal lines 24 may be power-supply, ground-return, or other lines that carry relatively large currents as compared to the currents carried by the digit lines 26. Thus, by allowing the signal lines 24 to have relatively large thicknesses even when the thicknesses of other lines formed from the same layer structure are reduced, the current-carrying capacities of the lines 24 are not degraded. Furthermore, in one embodiment of the invention, the memory array is formed in the region 22, and power-supply lines are formed in the region 20, which is peripheral to the memory array in the region 22. In another embodiment, the memory array includes both regions 20 and 22.

Figure 5:
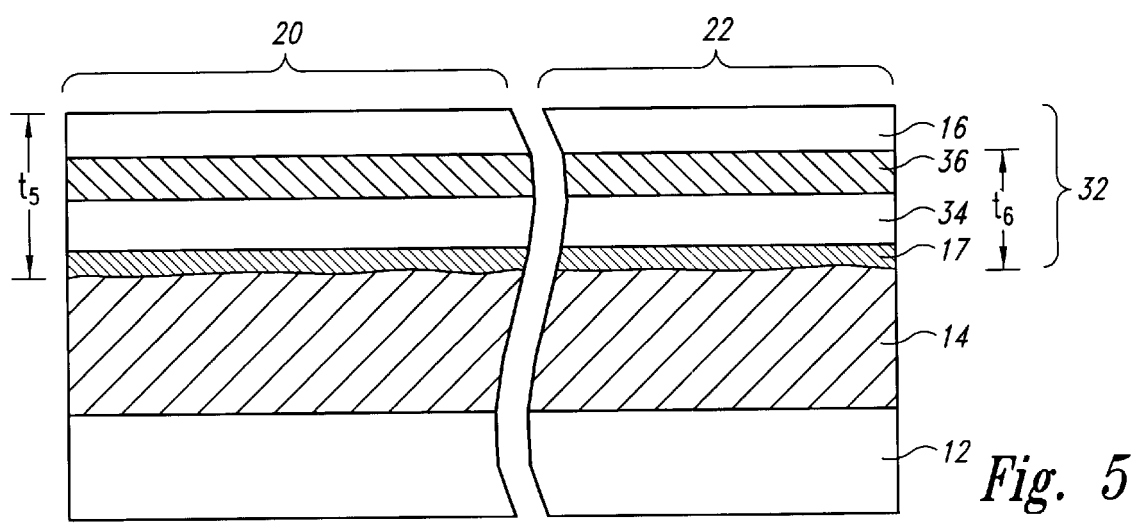
FIGS. 5–7 are cross-sectional views that show a method for forming a memory circuit according to a second embodiment of the invention.
Figure 6:
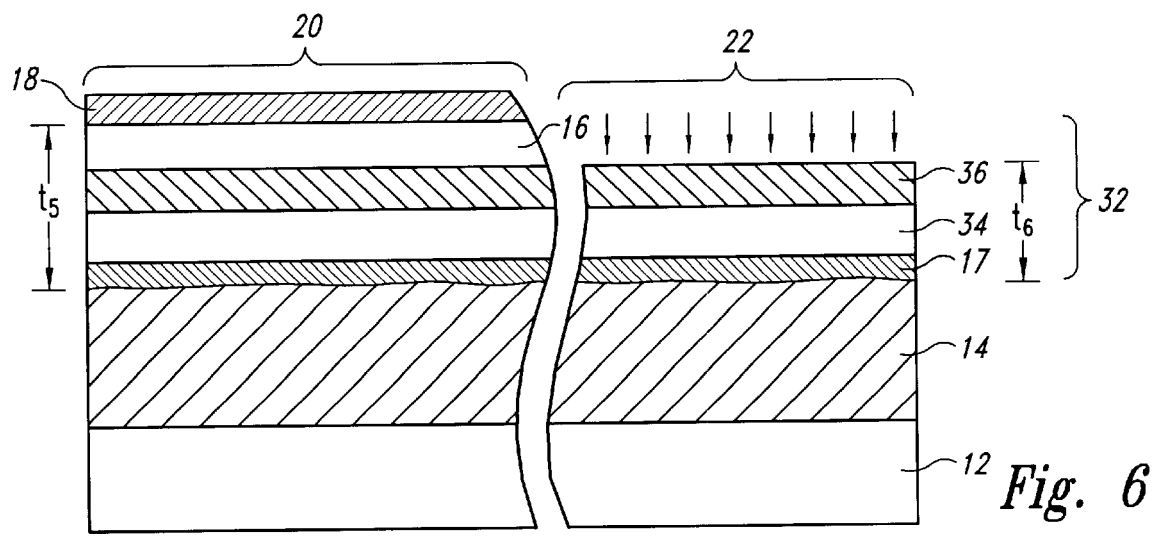
Figure 7:
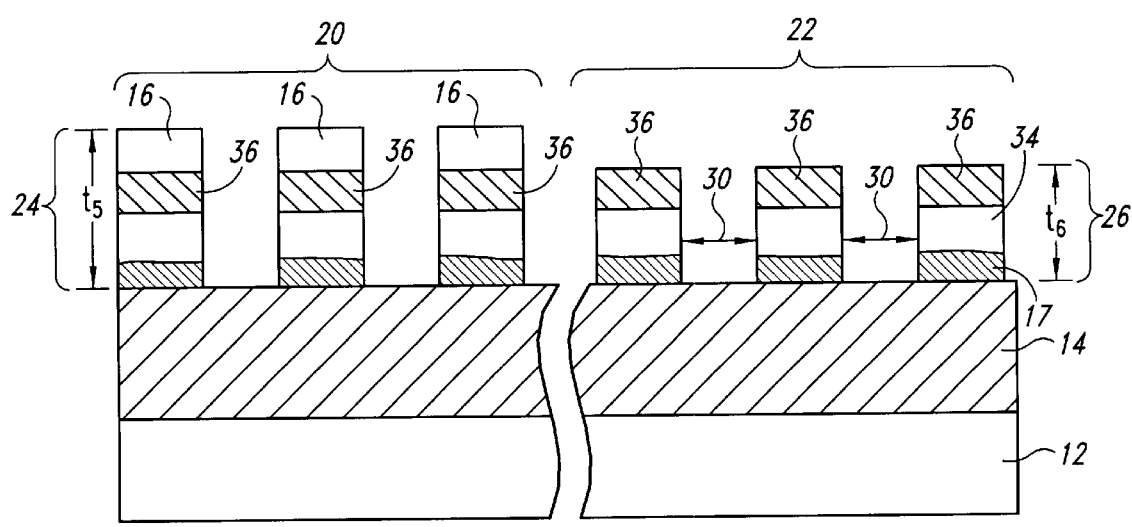

FIGS. 5–7 show a second embodiment of a method for forming a memory circuit having digit lines that are reduced in height with respect to other signal lines that are formed from the same conductive layer structure. During the etch of the layer 16 in the region 22 as discussed above, it is sometimes difficult to etch the layer structure 15 to a uniform thickness across the region 22. This difficulty may be caused Process characteristics, such as temperature and pressure, that vary at different points of the region 22.

Therefore, as discussed below, one major difference from the first embodiment is that the layer structure includes multiple conductive layers, one of which is an etch-stop layer.

Referring to FIG. 5, a conductive layer structure 32 is formed on the insulator layer 14 at a second level, and includes the optional barrier layer 17, a first conductive layer 34 that is formed on the barrier layer 17 in a first sublevel of the structure 32, a second conductive layer 36 formed on the layer 34 at a second sublevel, and the conductive layer 16, which, in this embodiment, is a third conductive layer formed on the layer 36 at a third sublevel. The structure 32 has a thickness of $t_5$, which is the sum of the thicknesses of the layers 16, 17, 34, and 36. Furthermore, the layers 17, 34, and 36 have a combined thickness $t_6$, which is less than the thickness $t^5$. Additionally, as discussed below, the layers 34 and 36 are formed from different materials. For example; the layer 36 may include titanium nitride or a titanium-tungsten alloy, and the layers 16 and 34 may include aluminum disposed by a conventional sputter/deposition step.

Referring to FIG. 6, the first mask 18 is formed over the region 20, and the exposed portion of the layer 16 in the region 22 is conventionally etched down to the layer 36, which acts as an etch-stop layer. That is, the etchant used to etch the layer 16 etches the layer 16 must faster than it etches the layer 36. Thus, the etch-stopping point can often be more reliably controlled than in the first embodiment described in conjunction with FIGS. 1–4. Next, the mask 18 is then removed. Thus, the layer structure 32 now has substantially the thickness $t_6$ in the region 22, and has substantially the thickness $t_5$ in the region 20.

Referring to FIG. 7, the digit lines 26 are formed in the region 22 from the layers 17, 34, and 36, and the signal lines 24 are formed in the region 20 from the layers 16, 17, 34, and 36. As in the first embodiment, the digit lines 26 are of the significantly reduced thickness, here $t_6$, as compared with the thickness of the signal lines 24, here $t_5$. This reduces the coupling capacitances between adjacent digit lines 26.

In another embodiment of the invention, the layer 34 is omitted such that the semiconductor structure 32 includes only the layers 16, 17, and 36. In this embodiment, the layers 17 and 36 are formed to the desired thickness $t_6$, and the digit lines 24 are formed from two layers, the layers 17 and 36, and not three layers as described in conjunction with FIGS. 5–7.

Figure 8:
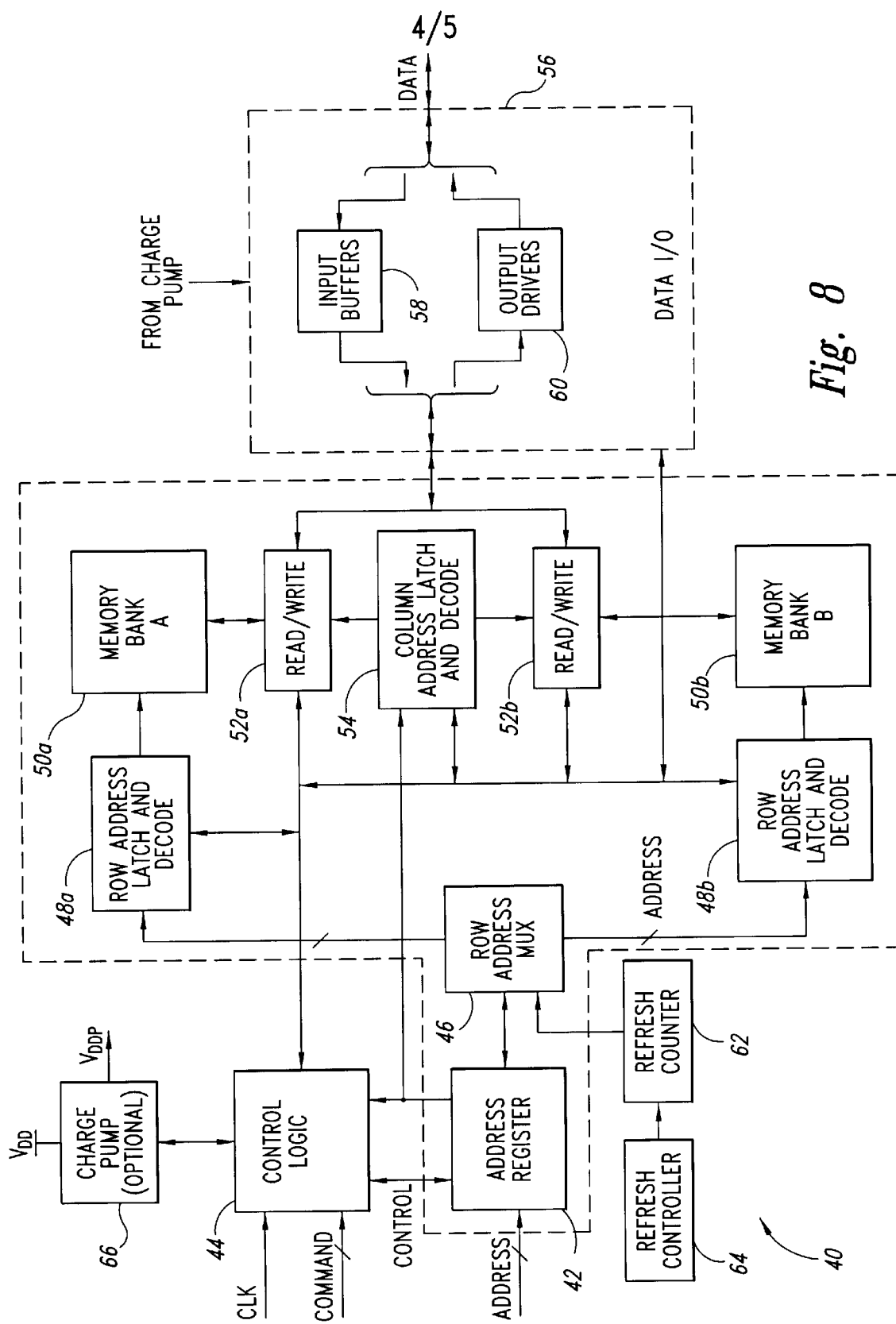
FIG. 8 is a block diagram of a memory circuit that can be formed according to the methods described in conjunction with FIGS. 1–4 and FIGS. 5–7.

FIG. 8 is a block diagram of one embodiment of a memory circuit 40 that can be formed according to the methods described above in conjunction with FIGS. 1–4 and FIGS. 5–7, respectively. The memory circuit 40 includes memory banks 50a and 50b. These memory banks each incorporate a memory array according to the invention. In one embodiment, the memory circuit 40 is a synchronous DRAM (SDRAM), although it may be another type of memory in other embodiments.

The memory circuit 40 includes an address register 42, which receives an address from an ADDRESS bus. A control logic circuit 44 receives a clock (CLK) signal, receives clock enable (CKE), chip select ($\overline{CS}$), row address strobe ($\overline{RAS}$), column address strobe ($\overline{CAS}$), and write enable ($\overline{WE}$) signals from the COMMAND bus, and communicates with the other circuits of the memory device 40. A row-address multiplexer 46 receives the address signal from the address register 42 and provides the row address to the row-address latch-and-decode circuits 48a and 48b for the memory bank 50a or the memory bank 50b, respectively. During read and write cycles, the row-address latch-and-decode circuits 48a and 48b activate the word lines of the addressed rows of memory cells in the memory banks 50a and 50b, respectively. Read/write circuits 52a and 52b read data from the addressed memory cells in the memory banks 50a and 50b, respectively, during a read cycle, and write data to the addressed memory cells during a write cycle. A column-address latch-and-decode circuit 54 receives the address from the address register 42 and provides the column address of the selected memory cells to the read/write circuits 52a and 52b. For clarity, the address register 42, the row-address multiplexer 46, the row-address latch-and-decode circuits 48a and 48b, and the column-address latch-and-decode circuit 54 can be collectively referred to as an address decoder.

A data input/output (I/O) circuit 56 includes a plurality of input buffers 58. During a write cycle, the buffers 58 receive and store data from the DATA bus, and the read/write circuits 52a and 52b provide the stored data to the memory banks 50a and 5Ob, respectively. The data I/O circuit 56 also includes a plurality of output drivers 60. During a read cycle, the read/write circuits 52a and 52b provide data from the memory banks 50a and 50b, respectively, to the drivers 60, which in turn provide this data to the DATA bus.

A refresh counter 62 stores the address of the row of memory cells to be refreshed either during a conventional auto-refresh mode or self-refresh mode. After the row is refreshed, a refresh controller 64 updates the address in the refresh counter 62, typically by either incrementing or decrementing the contents of the refresh counter 62 by one. Although shown separately, the refresh controller 64 may be part of the control logic 44 in other embodiments of the memory device 40.

The memory device 40 may also include an optional charge pump 66, which steps up the power-supply voltage $V_{DD}$ to a voltage $V_{DDP}$. In one embodiment, the pump 66 generates $V_{DDP}$ approximately 1–1.5 V higher than $V_{DD}$. The memory circuit 40 may also use $V_{DDP}$ to conventionally overdrive selected internal transistors.

Figure 9:
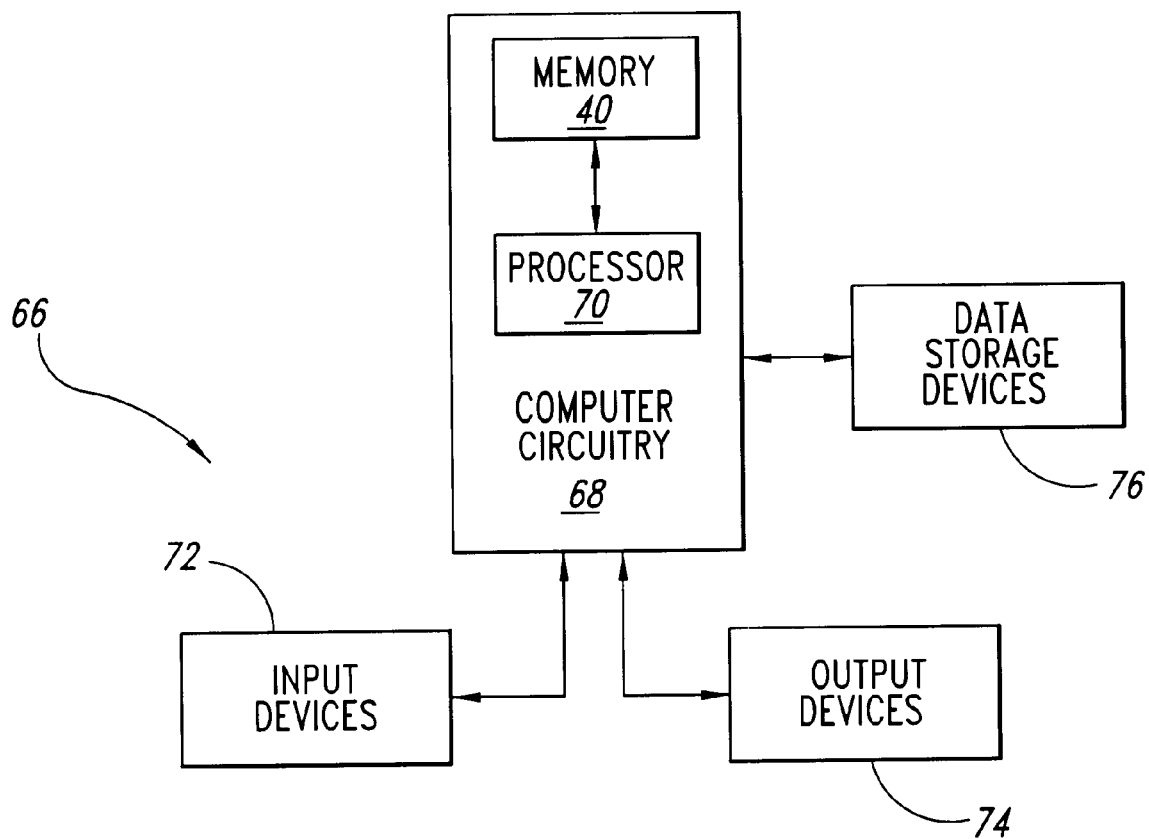
FIG. 9 is a block diagram of an electronic system that incorporates the memory circuit of FIG. 8.

FIG. 9 is a block diagram of an electronic system 66, such as a computer system, that incorporates the memory circuit 40 of FIG. 10. The system 66 also includes computer circuitry 68 for performing computer functions, such as executing software to perform desired calculations and tasks. The circuitry 68 typically includes a processor 70 and the memory circuit 40, which is coupled to the processor 70. One or more input devices 72, such as a keyboard or a mouse, are coupled to the computer circuitry 68 and allow an operator (not shown) to manually input data thereto. One or more output devices 74 are coupled to the computer circuitry 68 to provide to the operator data generated by the computer circuitry 68. Examples of such output devices 74 include a printer and a video display unit. One or more data-storage devices 76 are coupled to the computer circuitry 68 to store data on or retrieve data from external storage media (not shown). Examples of the storage devices 76 and the corresponding storage media include drives that accept hard and floppy disks, tape cassettes, and compact disk read-only memories (CD-ROMs). Typically, the computer circuitry 68 includes address data and command buses and a clock line that are respectively coupled to the ADDRESS, DATA, and COMMAND buses, and the CLK line of the memory device 40.

From the foregoing it will be appreciated that, although specific embodiments of the invention have been described herein for purposes of illustration, various modifications may be made without deviating from the spirit and scope of the invention. For example, although the invention is described with respect to digit lines and signal lines in a memory circuit, other types of conductors, such as word lines or other circuit interconnections, can be formed in the same level or from the same layer structure and have different thicknesses. Accordingly, the invention is not limited except as by the appended claims.

What is claimed is:

1. An integrated circuit memory device comprising:

a substrate;

an address decoder coupled to an address bus to receive an address, the address decoder being structured to generate row and column address signals corresponding to the address;

a memory array fabricated on the substrate, the memory array including a plurality of memory cells arranged in rows and columns, a plurality of row circuits fabricated on the substrate, each of the row circuits being coupled through a respective word line to a respective row of memory cells and being constructed to activate the respective row of memory cells responsive to a respective one of the row address signals, the array further including a sense amplifier fabricated on the substrate for each column of the array, the sense amplifier being coupled to a pair of complimentary digit lines for the respective column, at least one of the complimentary digit lines being coupled to each memory cell in the respective column, the digit lines for each column extending parallel and adjacent each other and having a first thickness in a direction normal to the substrate surface;

a data path coupled to data bus, the data path being structured to couple data to or from a memory cell in the activated row of memory cells and a column corresponding to the column address; and a conductive path disposed on the substrate having a second thickness in the direction normal to the substrate surface, the second thickness being greater than the first thickness.

2. The memory device of claim 1 wherein the digit lines and the conductive path are disposed on the substrate at the same level such that a surface of the conductive path facing away from the substrate is further away from the substrate than a surface of the digit lines facing away from the substrate.

3. The memory device of claim 1 wherein the conductive path comprises a power supply line coupling a supply voltage to components in the memory device.

4. The memory device of claim 1 further comprising a layer of insulative material formed on the substrate, the digit lines and the conductive path being formed on the insulative material.

5. The memory device of claim 1 wherein the digit line comprises a first portion of a first layer of a first conductive material disposed on the substrate, and the conductive path comprises a second portion of the first conductive material disposed on the substrate and a portion of a second conductive material disposed on the second portion of the first conductive material.

6. The memory device of claim 1 wherein the digit line comprises a first portion of a first layer of a conductive material disposed on the substrate and a first portion of a second layer of a conductive material disposed on the first portion of the first layer, and wherein the conductive path comprises a second portion of the first layer, a second portion of the second layer, and a portion of a third layer of a conductive material disposed on the second portion of the second layer.

7. The memory device of claim 1 wherein the digit line comprises a first portion of a first layer of a conductive material disposed on the substrate and a first portion of a conductive etch-stop material disposed on the first portion of the first layer, and wherein the conductive path comprises a second portion of the first layer, a second portion of the conductive etch-stop material disposed on the second portion of the first layer, and a portion of a third layer of a conductive material disposed on the second portion of the conductive etch-stop material.

8. The memory device of claim 1 wherein the digit line comprises a first portion of a barrier layer disposed on the substrate and a first portion of a conductive material formed on the first portion of the barrier layer, and wherein the conductive path comprises a second portion of the barrier layer and a second portion of the conductive material formed on the second portion of the barrier layer, the second portion of the conductive material having a thickness that is greater than the first portion of the conductive material.

9. The memory device of claim 1 wherein the digit line comprises a first portion of a conductive material formed on the substrate and a first portion of a cap layer disposed on the first portion of the conductive material, and wherein the conductive path comprises a second portion of the conductive material and a second portion of the cap layer disposed on the second portion of the conductive material, the second portion of the conductive material having a thickness that is greater than the first portion of the conductive material.

10. A memory array fabricated on a substrate, the memory array comprising:
   a plurality of memory cells arranged in rows and columns;
   a pair of complimentary digit lines for each column of memory cells, at least one of the complimentary digit lines for each column being coupled to each memory cell in the respective column, the digit lines for each column extending parallel and adjacent each other and having a first thickness in a direction normal to the substrate surface; and
   a conductive path disposed on the substrate having a second thickness in the direction normal to the substrate surface, the second thickness being greater than the first thickness.

11. The memory array of claim 10 wherein the digit lines and the conductive path are disposed on the substrate at the same level such that a surface of the conductive path facing away from the substrate is further away from the substrate than a surface of the digit lines facing away from the substrate.

12. The memory array of claim 10 wherein the conductive path comprises a power supply line coupling a supply voltage to components in the memory array.

13. The memory array of claim 10 further comprising a layer of insulative material formed on the substrate, the digit lines and the conductive path being formed on the insulative material.

14. The memory array of claim 10 wherein the digit line comprises a first portion of a first layer of a first conductive material disposed on the substrate, and the conductive path comprises a second portion of the first conductive material disposed on the substrate and a portion of a second conductive material disposed on the second portion of the first conductive material.

15. The memory array of claim 10 wherein the digit line comprises a first portion of a first layer of a conductive material disposed on the substrate and a first portion of a second layer of a conductive material disposed on the first portion of the first layer, and wherein the conductive path comprises a second portion of the first layer, a second portion of the second layer, and a portion of a third layer of a conductive material disposed on the second portion of the second layer.

16. The memory array of claim 10 wherein the digit line comprises a first portion of a first layer of a conductive material disposed on the substrate and a first portion of a conductive etch-stop material disposed on the first portion of the first layer, and wherein the conductive path comprises a second portion of the first layer, a second portion of the conductive etch-stop material disposed on the second portion of the first layer, and a portion of a third layer of a conductive material disposed on the second portion of the conductive etch-stop material.

17. The memory array of claim 10 wherein the digit line comprises a first portion of a barrier layer disposed on the substrate and a first portion of a conductive material formed on the first portion of the barrier layer, and wherein the conductive path comprises a second portion of the barrier layer and a second portion of the conductive material formed on the second portion of the barrier layer, the second portion of the conductive material having a thickness that is greater than the first portion of the conductive material.

18. The memory array of claim 10 wherein the digit line comprises a first portion of a conductive material formed on the substrate and a first portion of a cap layer disposed on the first portion of the conductive material, and wherein the conductive path comprises a second portion of the conductive material and a second portion of the cap layer disposed on the second portion of the conductive material, the second portion of the conductive material having a thickness that is greater than the first portion of the conductive material.

19. A computer system, comprising:
   a data input device;
   data output device; and
   computing circuitry coupled to the data input and output devices, the computing circuitry including a processor and a memory device, the memory device comprising:
      a substrate;
      an address decoder coupled to receive an address, the address decoder being structured to generate row and column address signals corresponding to the address;

a memory array fabricated on the substrate, the memory array including a plurality of memory cells arranged in rows and columns, a plurality of row circuits fabricated on the substrate, each of the row circuits being coupled through a respective word line to a respective row of memory cells and being constructed to activate the respective row of memory cells responsive to a respective one of the row address signals, the array further including a sense amplifier fabricated on the substrate for each column of the array, the sense amplifier being coupled to a pair of complimentary digit lines for the respective column, at least one of the complimentary digit lines being coupled to each memory cell in the respective column, the digit lines for each column extending parallel and adjacent each other and having a first thickness in a direction normal to the substrate surface;

a data path structured to couple data to or from a memory cell in the activated row of memory cells and a column corresponding to the column address; and a conductive path disposed on the substrate having a second thickness in the direction normal to the substrate surface, the second thickness being greater than the first thickness.

20. The computer system of claim 19 wherein the digit lines and the conductive path are disposed on the substrate at the same level such that a surface of the conductive path facing away from the substrate is further away from the substrate than a surface of the digit lines facing away from the substrate.

21. The computer system of claim 19 wherein the conductive path comprises a power supply line coupling a supply voltage to components in the memory device.

22. The computer system of claim 19 further comprising a layer of insulative material formed on the substrate, the digit lines and the conductive path being formed on the insulative material.

23. The computer system of claim 19 wherein the digit line comprises a first portion of a first layer of a first conductive material disposed on the substrate, and the conductive path comprises a second portion of the first conductive material disposed on the substrate and a portion of a second conductive material disposed on the second portion of the first conductive material.

24. The computer system of claim 19 wherein the digit line comprises a first portion of a first layer of a conductive material disposed on the substrate and a first portion of a second layer of a conductive material disposed on the first portion of the first layer, and wherein the conductive path comprises a second portion of the first layer, a second portion of the second layer, and a portion of a third layer of a conductive material disposed on the second portion of the second layer.

25. The computer system of claim 19 wherein the digit line comprises a first portion of a first layer of a conductive material disposed on the substrate and a first portion of a conductive etch-stop material disposed on the first portion of the first layer, and wherein the conductive path comprises a second portion of the first layer, a second portion of the conductive etch-stop material disposed on the second portion of the first layer, and a portion of a third layer of a conductive material disposed on the second portion of the conductive etch-stop material.

26. The computer system of claim 19 wherein the digit line comprises a first portion of a barrier layer disposed on the substrate and a first portion of a conductive material formed on the first portion of the barrier layer, and wherein the conductive path comprises a second portion of the barrier layer and a second portion of the conductive material formed on the second portion of the barrier layer, the second portion of the conductive material having a thickness that is greater than the first portion of the conductive material.

27. The computer system of claim 19 wherein the digit line comprises a first portion of a conductive material formed on the substrate and a first portion of a cap layer disposed on the first portion of the conductive material, and wherein the conductive path comprises a second portion of the conductive material and a second portion of the cap layer disposed on the second portion of the conductive material, the second portion of the conductive material having a thickness that is greater than the first portion of the conductive material.

* * * * *